United States Patent
Jeon et al.

(10) Patent No.: US 10,749,019 B2
(45) Date of Patent: Aug. 18, 2020

(54) CIRCUIT AND ELECTRONIC DEVICE INCLUDING AN ENHANCEMENT-MODE TRANSISTOR

(71) Applicant: SEMICONDUCTOR COMPONENTS INDUSTRIES, LLC, Phoenix, AZ (US)

(72) Inventors: Woochul Jeon, Phoenix, AZ (US); Prasad Venkatraman, Gilbert, AZ (US)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 0 days.

(21) Appl. No.: 16/026,897

(22) Filed: Jul. 3, 2018

(65) Prior Publication Data

US 2020/0013886 A1  Jan. 9, 2020

(51) Int. Cl.
*H01L 29/778* (2006.01)
*H01L 27/06* (2006.01)
*H01L 27/088* (2006.01)

(52) U.S. Cl.
CPC ...... *H01L 29/7786* (2013.01); *H01L 27/0629* (2013.01); *H01L 27/0883* (2013.01)

(58) Field of Classification Search
CPC ............ H01L 29/7786; H01L 27/0629; H01L 27/0883
See application file for complete search history.

(56) References Cited

U.S. PATENT DOCUMENTS

| | | | | |
|---|---|---|---|---|
| 4,198,696 A * | 4/1980 | Bertin | ..................... | G11C 17/12 257/E23.146 |
| 4,471,245 A * | 9/1984 | Janutka | ............ | H03K 17/04123 327/376 |
| 4,701,646 A * | 10/1987 | Richardson | ........ | H03K 19/0952 136/293 |
| 4,742,380 A * | 5/1988 | Chang | ................. | H01L 27/0705 257/113 |
| 4,931,778 A * | 6/1990 | Guajardo | ................. | H02H 3/04 340/638 |

(Continued)

OTHER PUBLICATIONS

U.S. Appl. No. 15/977,051, filed May 11, 2018, Inventors: Jaume Roig-Guitart et al., specification pp. 1-20, drawings sheets 1-8.

*Primary Examiner* — Victor A Mandala (74) *Attorney, Agent, or Firm* — Abel Schillinger, LLP (57) ABSTRACT

An electronic device can include a channel layer and a barrier layer overlying the channel layer. In an embodiment, the electronic device can include a component disposed along a current path between a gate terminal and a gate electrode of a first transistor. In another embodiment, the electronic device can include a second transistor wherein source and gate electrodes of the second transistor are coupled to the gate electrode of the first transistor, and a drain electrode of the second transistor is coupled to the gate terminal. A circuit can include a transistor and a diode. The transistor can include a drain, a gate, and a source, wherein the drain is coupled to a drain terminal, and the source is coupled to a source terminal. The diode can have an anode is coupled to the gate terminal, and a cathode is coupled to a gate of the transistor.

17 Claims, 6 Drawing Sheets

(56) References Cited

U.S. PATENT DOCUMENTS

| | | | | |
|---|---|---|---|---|
| 5,691,935 A | * | 11/1997 | Douglass | G11C 11/24 365/102 |
| 5,744,823 A | * | 4/1998 | Harkin | H01L 27/1237 257/68 |
| 10,249,615 B2 | * | 4/2019 | Green | H01L 27/0629 |
| 2005/0110042 A1 | | 5/2005 | Saito et al. | |
| 2005/0167742 A1 | * | 8/2005 | Challa | H01L 29/66734 257/328 |
| 2006/0138454 A1 | | 6/2006 | Saito et al. | |
| 2006/0238135 A1 | * | 10/2006 | Kimura | G09G 3/20 315/169.3 |
| 2008/0080108 A1 | * | 4/2008 | Lin | H01L 27/0285 361/56 |
| 2009/0152443 A1 | * | 6/2009 | Tajiri | H03K 17/785 250/206 |
| 2011/0220916 A1 | * | 9/2011 | Shimizu | H01L 27/0629 257/77 |
| 2012/0193637 A1 | * | 8/2012 | Kalnitsky | H01L 21/0262 257/76 |
| 2013/0082276 A1 | | 4/2013 | Park et al. | |
| 2014/0015591 A1 | * | 1/2014 | Chen | H01L 27/095 327/380 |
| 2014/0055192 A1 | * | 2/2014 | Ritenour | H03K 17/08 327/436 |
| 2014/0091324 A1 | * | 4/2014 | Zushi | H01L 27/0682 257/77 |
| 2014/0264431 A1 | * | 9/2014 | Lal | H01L 29/0619 257/121 |
| 2014/0375372 A1 | * | 12/2014 | Ikeda | H03K 17/102 327/333 |
| 2016/0005725 A1 | * | 1/2016 | Ikeda | H03K 17/6871 257/76 |
| 2016/0218100 A1 | * | 7/2016 | Ikeda | H01L 28/20 |
| 2017/0005203 A1 | * | 1/2017 | Endo | H01L 29/42384 |
| 2018/0068997 A1 | * | 3/2018 | Jeon | H01L 29/7786 |

* cited by examiner

CIRCUIT AND ELECTRONIC DEVICE INCLUDING AN ENHANCEMENT-MODE TRANSISTOR

FIELD OF THE DISCLOSURE

The present disclosure relates to circuits and electronic devices, and more particularly to, circuits and electronic devices including enhancement-mode transistors.

RELATED ART

High electron mobility transistors can include enhancement-mode transistors. One type of such transistor can include a p-type GaN gate electrode. A high electron mobility transistor having a p-type GaN gate electrode can have a threshold voltage of approximately 1.5 V. In an attempt to increase the threshold voltage, a component may be added between a gate terminal and the p-type GaN gate electrode. The component may include a Schottky diode between a metal gate interconnect and the p-type GaN gate electrode, where the metal gate interconnect is coupled to the cathode of the Schottky diode, and the p-type GaN gate electrode is coupled to the anode of the Schottky diode. In another structure, an n-type GaN layer may be disposed between the metal gate interconnect and the p-type GaN gate electrode. A pn junction diode forms at the interface between the n-type GaN layer and the p-type GaN gate electrode. In a further structure, a dielectric layer may be disposed between the p-type GaN gate electrode and an interconnect that is connected to a source electrode of the transistor. Such attempts to increase the threshold voltage can result in too high of a threshold voltage, the threshold can become unstable and may shift over time, or control over the transistor may be compromised. Further improvement of enhancement-mode high electron mobility transistors without the previously mentioned adverse complications is desired.

BRIEF DESCRIPTION OF THE DRAWINGS

Embodiments are illustrated by way of example and are not limited in the accompanying figures.

Skilled artisans appreciate that elements in the figures are illustrated for simplicity and clarity and have not necessarily been drawn to scale. For example, the dimensions of some of the elements in the figures may be exaggerated relative to other elements to help to improve understanding of embodiments of the invention.

DETAILED DESCRIPTION

The following description in combination with the figures is provided to assist in understanding the teachings disclosed herein. The following discussion will focus on specific implementations and embodiments of the teachings. This focus is provided to assist in describing the teachings and should not be interpreted as a limitation on the scope or applicability of the teachings. However, other embodiments can be used based on the teachings as disclosed in this application.

A III-V material is intended to mean a material that includes at least one Group 13 and at least one Group 15 element. A III-N material is intended to mean a semiconductor material that includes at least one Group 13 element and nitrogen.

The term "metal" or any of its variants is intended to refer to a material that includes an element that is within any of the Groups 1 to 12, and within Groups 13 to 16, an element that is along and below a line defined by atomic numbers 13 (Al), 31 (Ga), 50 (Sn), 51 (Sb), and 84 (Po). Metal does not include Si or Ge.

The term "pn junction diode" is intended to mean to a diode formed at the junction of p-type semiconductor material and n-type semiconductor material. Compare a pn junction diode with a Schottky diode that is formed at an interface of a metal material and a semiconductor material having a relatively low to moderate dopant concentration, such as at most $1 \times 10^{18}$ atoms/cm$^3$.

The term "semiconductor base material" refers to the principal material within a semiconductor substrate, region, or layer, and does not refer to any dopant within the semiconductor substrate, region, or layer. A boron-doped Si layer has Si as the semiconductor base material, and a C-doped GaN layer has GaN as the semiconductor base material.

The term "threshold voltage" with respect to a component is intended to mean to a voltage at which significant current (greater than leakage current) flows through such component. For a diode, the threshold voltage corresponds to a forward-bias voltage at which significant current begins to flow through the diode. For many diodes, such a forward-voltage is in a range from 1 V to 2 V. For an n-channel depletion mode transistor, a voltage just above the pinch-off voltage corresponds to a threshold voltage.

The terms "comprises," "comprising," "includes," "including," "has," "having" or any other variation thereof, are intended to cover a non-exclusive inclusion. For example, a method, article, or apparatus that comprises a list of features is not necessarily limited only to those features but may include other features not expressly listed or inherent to such method, article, or apparatus. Further, unless expressly stated to the contrary, "or" refers to an inclusive-or and not to an exclusive-or. For example, a condition A or B is satisfied by any one of the following: A is true (or present) and B is false (or not present), A is false (or not present) and B is true (or present), and both A and B are true (or present).

Also, the use of "a" or "an" is employed to describe elements and components described herein. This is done merely for convenience and to give a general sense of the scope of the invention. This description should be read to include one, at least one, or the singular as also including the plural, or vice versa, unless it is clear that it is meant otherwise. For example, when a single item is described herein, more than one item may be used in place of a single item. Similarly, where more than one item is described herein, a single item may be substituted for that more than one item.

The use of the word "about", "approximately", or "substantially" is intended to mean that a value of a parameter is close to a stated value or position. However, minor differences may prevent the values or positions from being exactly as stated. Thus, differences of up to ten percent (10%) for the value are reasonable differences from the ideal goal of exactly as described.

Group numbers correspond to columns within the Periodic Table of Elements based on the IUPAC Periodic Table of Elements, version dated Nov. 28, 2016.

Unless otherwise defined, all technical and scientific terms used herein have the same meaning as commonly understood by one of ordinary skill in the art to which this invention belongs. The materials, methods, and examples are illustrative only and not intended to be limiting. To the extent not described herein, many details regarding specific materials and processing acts are conventional and may be found in textbooks and other sources within the semiconductor and electronic arts.

A circuit and electronic device can include an enhancement-mode transistor that allows for an increased threshold voltage that is more stable over time while maintaining an acceptably low gate current. The circuit and electronic device are well suited for an enhancement-mode high electron mobility transistor (HEMT). In an embodiment, a diode can be used between a gate terminal and a gate of the HEMT. An anode of the diode is coupled to the gate terminal, and a cathode of the diode is coupled to the gate of the transistor. Thus, the diode is forward biased when the circuit is turned on. Thus, the threshold of the circuit can be a function of the sum of the forward-bias on-state voltage of the diode and the threshold voltage of the transistor. Compare such a circuit to a conventional circuit where the diode has a reverse configuration, and in particular, a cathode of the diode is coupled to the gate terminal, an anode is coupled to the gate of the transistor. The threshold of the conventional circuit can be a function of the sum of the reverse-bias breakdown voltage of the diode and the threshold voltage of the transistor. The new circuit and electronic device can provide for better control over the threshold voltage of the circuit that is more stable over time. The circuit and electronic device are well suited for HEMTs, and all components within the circuit and electronic device can be integrated into a single die without any additional masking or other processing operations or increasing the total area occupied by the circuit and device.

In an aspect, an electronic device can include a channel layer overlying a substrate; a barrier layer overlying the channel layer; a gate electrode of a transistor overlying the channel layer; a gate terminal; and a component having a threshold voltage. The component is disposed along a current path between the gate terminal and the gate electrode.

In another aspect, an electronic device can include a channel layer overlying a substrate; a barrier layer overlying the channel layer; a gate electrode of a first transistor overlying the channel layer; a gate terminal; and a second transistor having a source electrode, a gate electrode, and a drain electrode. The source and gate electrodes of the second transistor are coupled to the gate electrode of the first transistor, and the drain electrode of the second transistor is coupled to the gate terminal.

In a further aspect, a circuit can include a drain terminal, a gate terminal, and a source terminal, a transistor, and a diode. The transistor can include a drain, a gate, and a source, wherein the drain is coupled to the drain terminal, and the source is coupled to the source terminal. The diode can have an anode and a cathode, wherein the anode is coupled to the gate terminal, and the cathode is coupled to the gate of the transistor.

Figure 1:
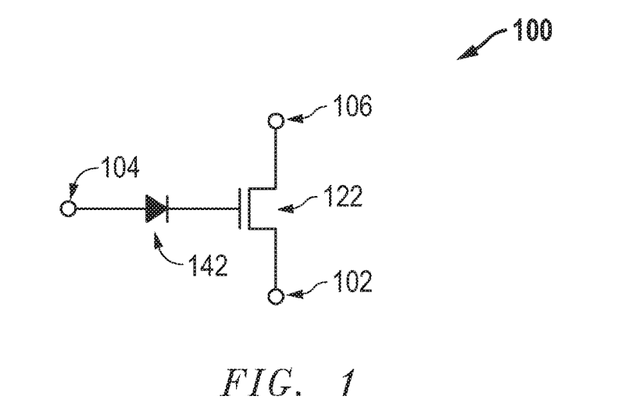
FIG. 1 includes a schematic diagram of a circuit including a transistor and a diode in accordance with an embodiment.

FIG. 1 includes a circuit 100 in accordance with an embodiment. The circuit includes a source terminal 102, a gate terminal 104, and a drain terminal 106. The circuit includes a transistor 122 that has a source, a gate, and a drain. The source is coupled to the source terminal 102, and the drain is coupled to the drain terminal 106. In an embodiment, the transistor is a HEMT, and in a particular embodiment, is an enhancement-mode HEMT. The circuit 100 further includes a diode 142 having an anode and a cathode, wherein the anode is coupled to the gate terminal 104, and the cathode is coupled to the gate of the transistor 122. The diode 142 can be a Schottky diode or a pn junction diode. Although not illustrated, other components may be used, such as gate controller that controls gate signals used to turn on and off the transistor 122, a gate driver to provide sufficient gate voltage to operate the transistor 122, another suitable component, or any combination thereof.

The diode 142 helps to increase the voltage at the gate terminal 104 needed to turn on the circuit 100. In a non-limiting embodiment, the diode 142 can double the voltage needed at the gate terminal 104 to turn on the transistor 122. When the transistor 122 is turned on and off infrequently, charge may accumulate between the diode 142 and gate of the transistor 122 after the transistor 122 is turned on. When the transistor 122 is turned off, the source and gate terminals 102 and 104 may be at substantially the same voltage. The accumulated charge causes the diode 142 to be reversed biased because the cathode of the diode 142 is at a higher voltage as compared to the anode of the diode 142. The accumulated charge may be dissipated as the leakage current through the diode 142.

Figure 2:
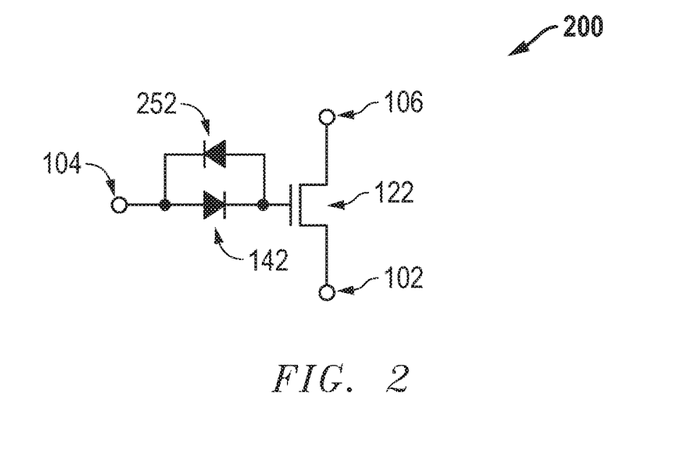
FIG. 2 includes a schematic diagram of a circuit including a transistor and back-to-back diodes in accordance with another embodiment.
Figure 3:
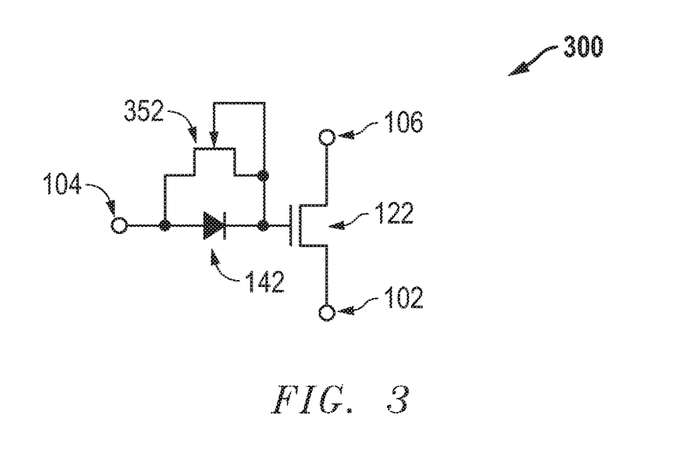
FIG. 3 includes a schematic diagram of a circuit including a transistor and a combination of a diode and another transistor connected in parallel in accordance with a further embodiment.

In another embodiment, the transistor 122 may be turned on and off more frequently. Thus, the accumulated charge between the diode 142 and the gate of the transistor 122 may need to be dissipated quicker. FIGS. 2 and 3 include embodiments in which an additional component can be used to help dissipate the accumulated charge without significantly interfering with the operation of the circuits when the transistor 122 is on.

In FIG. 2, a circuit 200 includes diodes 142 and 252 in a back-to-back diode configuration. In particular, the diode 252 includes an anode and a cathode, wherein the anode of the diode 252 is coupled to the cathode of the diode 142, and the cathode of the diode 252 is coupled to the anode of the diode 142. In an embodiment, the on-state forward bias voltage (a particular type of threshold voltage) of the diode 252 is less than the threshold voltage of the transistor 122. Thus, the accumulated charge at the node between the gate of the transistor 122 and the diodes 142 and 252 can be made less than the threshold voltage of the transistor 122. Similar to the diode 142, the diode 252 can be a Schottky diode, a pn junction diode, or a junction barrier diode. A junction barrier diode is a mixture of Schottky and pn junction diodes with pattern and is well known structure to lower the turn-on voltage in SiC diodes. The diodes 142 and 252 may be of the same type (e.g., both Schottky diodes or both pn junction diodes) or different types (e.g., one diode is a Schottky diode, and the other diode is a pn junction diode) and may have the same or different properties (e.g., on-state forward bias voltage, area, resistance between the gate electrode and terminals of the diodes (for example, the cathode of the diode 142 and the anode of the diode 252).

In FIG. 3, a circuit 300 includes a transistor 352 having a source, gate, and drain. The gate and source of the transistor 352 is coupled to the cathode of the diode 142, and the drain of the transistor 352 is coupled to the anode of the diode 142. In an embodiment, the transistor 352 is a depletion-mode transistor, and in a particular embodiment is a depletion-mode HEMT. In another embodiment (not illustrated), the transistor 352 can be an enhancement-mode transistor. When an enhancement-mode transistor is used for the transistor 352, the threshold voltage of the transistor 352 is less than the threshold voltage of the transistor 122. Thus, the accumulated charge at the node between the gate of the transistor 122 and the diode 142 and the transistor 352 can be made less than the threshold voltage of the transistor 122.

Figure 4:
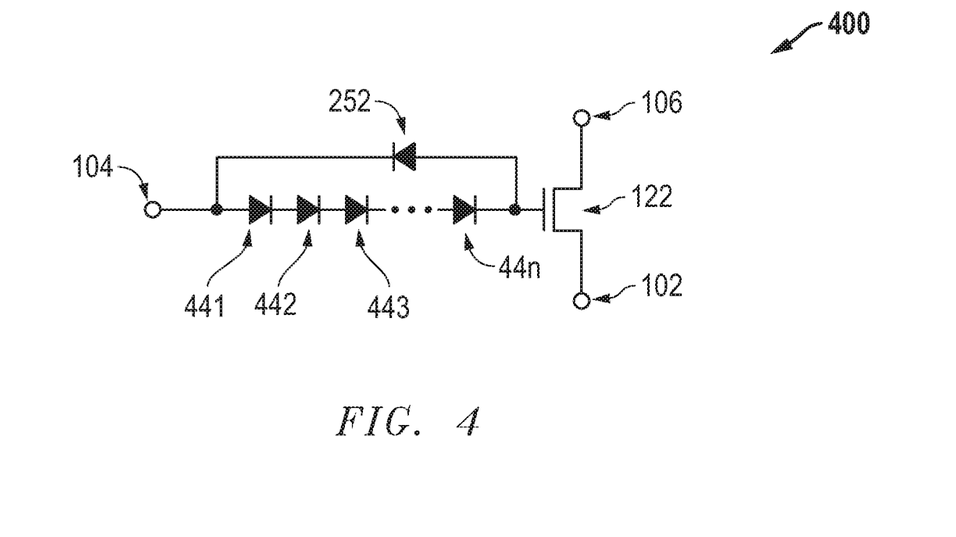
FIG. 4 includes a schematic of a diagram circuit including a transistor and a set of diodes connected in series and another diode connected in parallel with the set of diodes in accordance with still another embodiment.

FIG. 4 includes a circuit 400 that include a set of diodes 441, 442, 443, . . . 44n that are connected in series. As used herein, the branch of the circuit 400 that includes the diodes 441 to 44n is referred to as the accumulation branch, and the branch of the circuit 400 that includes the diode 252 is referred to as the dissipation branch. In this embodiment, the additional diodes along the accumulation branch help to further increase the voltage at the gate terminal 104 used to turn on the transistor 122. Within the accumulation branch, skilled artisans can perform circuit simulations to determine the number of diodes that should be serially connected within the accumulation branch. FIG. 4 further illustrates the diode 252, and in another embodiment, the transistor 352 can be used in the dissipation branch instead of the diode 252. In a particular embodiment, more than one diode or transistor may be used in the dissipation branch. When more than one component is used within the dissipation branch, such components may be connected in parallel with each other. Thus, the number of diodes within the accumulation branch can be different from the number of components within the dissipation branch.

Attention is now directed to physical structures and a process flow used to achieve the previously described circuits. The focus will be principally on the circuits in FIGS. 1 to 3. After reading this specification, skilled artisans will be able to modify the physical components and process flow in order to achieve the circuits as illustrated in FIG. 4.

Figure 5:
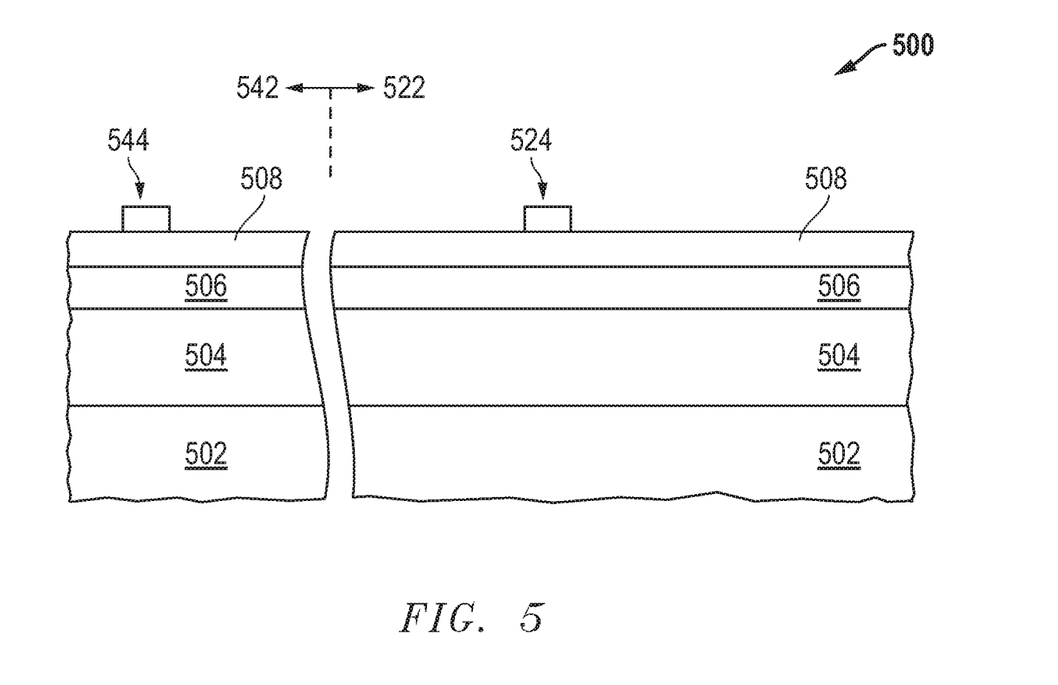
FIG. 5 includes an illustration of a cross-sectional view of a portion of a workpiece including a substrate and several layers after patterning a gate electrode layer.

FIG. 5 includes a cross-sectional view of a portion of a workpiece 500 where a HEMT is being formed. Referring to the previously described circuits, the workpiece 500 includes a portion 522 where transistor structures corresponding to the transistor 122 are being formed, and a portion 542 where component structures corresponding to component(s) between the gate terminal 104 and the gate of the transistor 122 are being formed. The workpiece can include a substrate 502, a buffer layer 504, a channel layer 506, a barrier layer 508, a gate electrode 524, and a semiconductor member 544. The substrate 502 can include silicon, sapphire (monocrystalline $Al_2O_3$), silicon carbide (SiC), aluminum nitride (AlN), gallium oxide ($Ga_2O_3$), spinel ($MgAl_2O_4$), another suitable substantially monocrystalline material, or the like. The selection of the particular material and crystal orientation along the primary surface can be selected depending upon the composition of the overlying semiconductor layers.

The buffer layer 504 can include a III-N material, and in a particular embodiment, include $Al_aGa_{(1-a)}N$, where $0 \le a \le 1$. The composition of the buffer layer 504 may depend on the composition of the channel layer 506 and the designed operating voltage of the HEMT. The composition of the buffer layer 504 can be changed as a function of thickness, such that the buffer layer 504 has a relatively greater aluminum content closer to the substrate 502 and relatively greater gallium content closer to the channel layer 506. In a particular embodiment, the cation (metal atoms) content in the buffer layer 504 near the substrate 502 can be 10 atomic % to 100 atomic % Al with the remainder Ga, and the cation content in the buffer layer 504 near the channel layer 506 can be 0 atomic % to 50 atomic % Al with the remainder Ga. In another embodiment, the buffer layer 504 can include a plurality of films. The buffer layer 504 can have a thickness in a range from approximately 1 micron to 5 microns.

The channel layer 506 can include a semiconductor base material, such as $Al_zGa_{(1-z)}N$, where $0 \le z \le 0.1$ and have a thickness in a range from approximately 20 nm to 4000 nm. In a particular embodiment, the channel layer 506 is a GaN layer (z=0). The channel layer 506 may be unintentionally doped or doped with an electron donor (n-type) dopant or an electron acceptor (p-type) dopant. In an embodiment, the concentration of acceptors (when the carriers are electrons) or donors (when the carriers are holes) may be kept as low as reasonably possible.

In a particular embodiment, acceptors can include carbon from a source gas (e.g., $Ga(CH_3)_3$) when metalorganic chemical vapor deposition (MOCVD) is used to form the channel layer 506. In a particular embodiment, the lowest trap concentration is desired but may be limited by growth or deposition conditions and purity of the precursors. Thus, some carbon can become incorporated as the channel layer 506 is grown, and, such carbon can result in unintentional doping. The carbon content may be controlled by controlling the deposition conditions, such as the deposition temperature and flow rates. In an embodiment, the channel layer 506 has a carrier impurity concentration that is greater than 0 and at most $1 \times 10^{14}$ atoms/cm$^3$, at most $1 \times 10^{15}$ atoms/cm$^3$, or at most $1 \times 10^{16}$ atoms/cm$^3$. In a particular embodiment, the carrier impurity concentration is in a range from $1 \times 10^{13}$ atoms/cm$^3$ to $1 \times 10^{16}$.

In an embodiment, the channel layer 506 has a thickness that is at least 50 nm. When the thickness is less than 50 nm, a 2DEG may be more difficult to generate, maintain, or both. In another embodiment, the channel layer 506 has a thickness that is at most 5000 nm. In a particular embodiment, the thickness in a range from 50 nm to 300 nm can provide a sufficiently thick channel layer 506 to allow for the proper generation and maintaining of the 2DEG and still obtain a reasonable on-state resistance ($R_{DSON}$).

The barrier layer 508 can include a III-V semiconductor material, such as a III-N semiconductor material. In a particular embodiment, the barrier layer can include $Al_bIn_cGa_{(1-b-c)}N$, wherein $0<b\le1$ and $0\le c\le0.3$. The barrier layer 508 can include a single film or a plurality of films. When the barrier layer 508 includes a plurality of films, the aluminum content can remain substantially the same or increase as distance from the channel layer 506 increases. As the aluminum content in the barrier layer 508 increases, the thickness of the barrier layer 508 may be relatively thinner. In an embodiment, the barrier layer 508 has a thickness of at least 10 nm, and in another embodiment, the barrier layer 508 has a thickness of at most 150 nm. In a particular embodiment, the barrier layer 508 has a thickness in a range from 20 nm to 90 nm.

In an embodiment, the gate electrode 524 and the semiconductor member 544 can be formed from a gate electrode layer. The transistor structures (corresponding to the transistor 122) being formed are enhancement-mode HEMTs. The gate electrode 524 and the semiconductor member 544 can include a p-type semiconductor material. In a particular embodiment, the gate electrode 524 and the semiconductor member 544 can include p-type GaN. The p-type dopant can include Mg, Zn, Cd, or the like. The gate electrode 524 and the semiconductor member 544 can have a thickness in a range from 10 nm to 300 nm. In another embodiment, the gate electrode 524 and the semiconductor member 544 can be thicker, if needed or desired.

In an embodiment, the gate electrode 524 and the semiconductor member 544 can be formed from a gate electrode layer. Skilled artisans may select one of several techniques to form the gate electrode 524 and the semiconductor member 544 from the gate electrode layer. For example, the gate electrode layer may be deposited on the barrier layer 508 or a patterned layer may be formed before forming the gate electrode layer. In an embodiment, the patterned layer may include a sacrificial layer that is removed after forming the gate electrode 524 and the semiconductor member 544. In another embodiment (not illustrated), the patterned layer can include access regions for the source and drain electrodes that are formed over the channel layer. In this embodiment, the patterned layer can remain within the finished transistor structures. For simplicity, the gate electrode 524 and the semiconductor member 544 are illustrated as being on the barrier layer 508. In another embodiment, the gate electrode 524, the semiconductor member 544, or both may be recessed within the barrier layer 508 or contact the channel layer 506. After reading this specification, skilled artisans will be able to select a process technique in forming the gate electrode 524 and the semiconductor member 544 to meet the needs or desires for a particular application. In a further embodiment (not illustrated), a spacer layer be formed between the channel layer 506 and the barrier layer 508.

Figure 6:
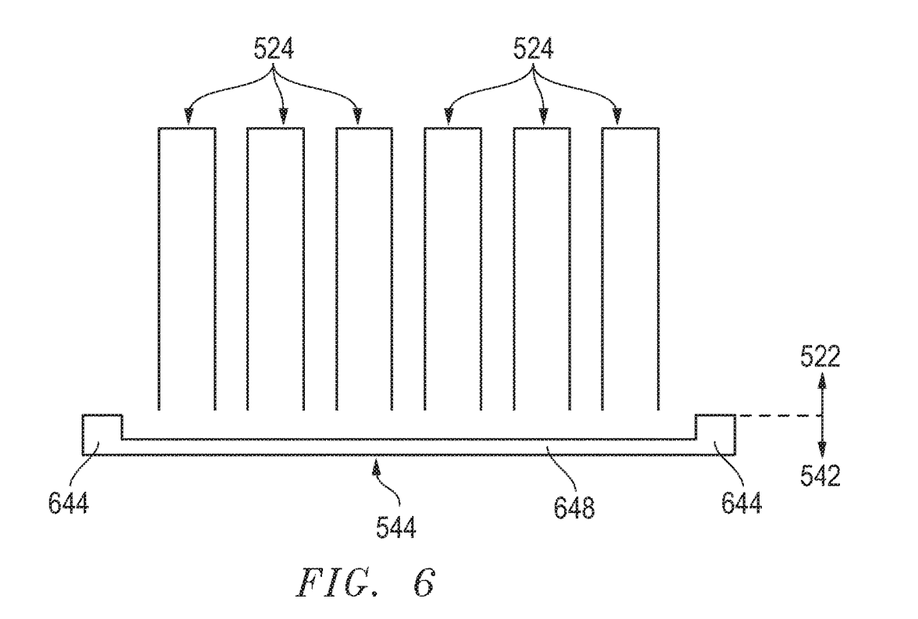
FIG. 6 includes an illustration of a top view after patterning the gate electrode layer, as seen in FIG. 5.

FIG. 6 includes an exemplary layout for the electronic device. The portion 522 includes the gate electrode 524, and the portion 542 includes the semiconductor member 544.

Note that the gate electrode 524 and the semiconductor member 544 are spaced apart and do not contact each other. The shape of the semiconductor member 544 can correspond to a gate terminal interconnect, and the semiconductor member 544 can have portions 644 corresponding to the subsequently formed gate pads and the portion 648 corresponding to a gate runner, where the gate pads and gate runner are formed at a higher lever interconnect that will be subsequently formed. Source and drain electrodes have not yet been formed, and therefore are not illustrated in FIG. 6.

Figure 7:
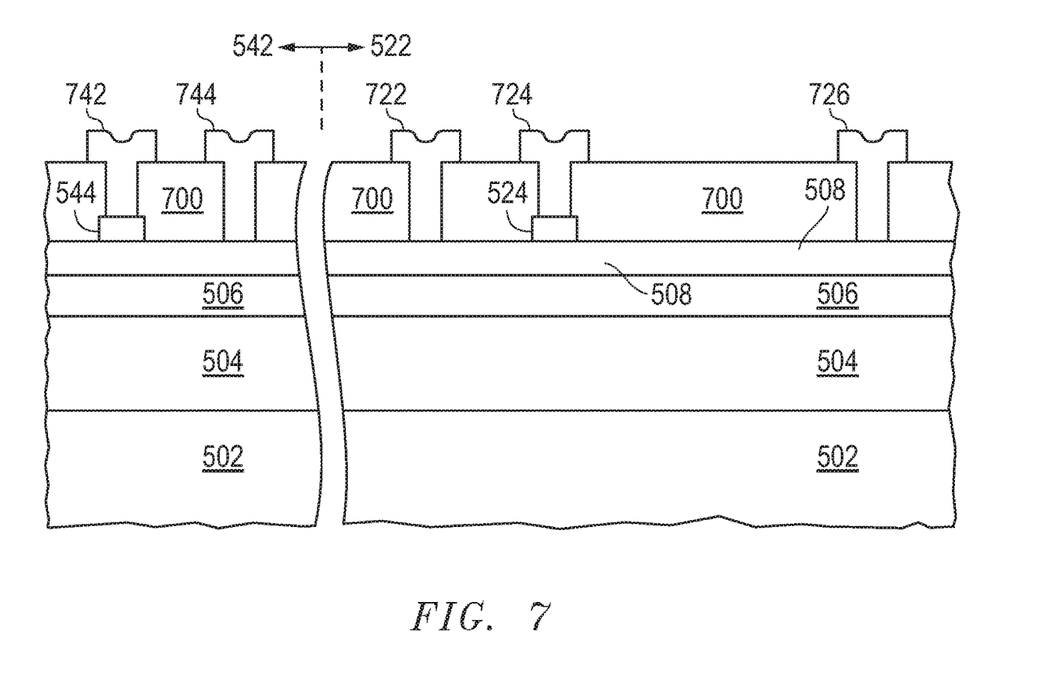
FIG. 7 includes an illustration of a cross-sectional view of the workpiece of FIG. 6 after forming a source electrode, a drain electrode, and a set of interconnects.
Figure 8:
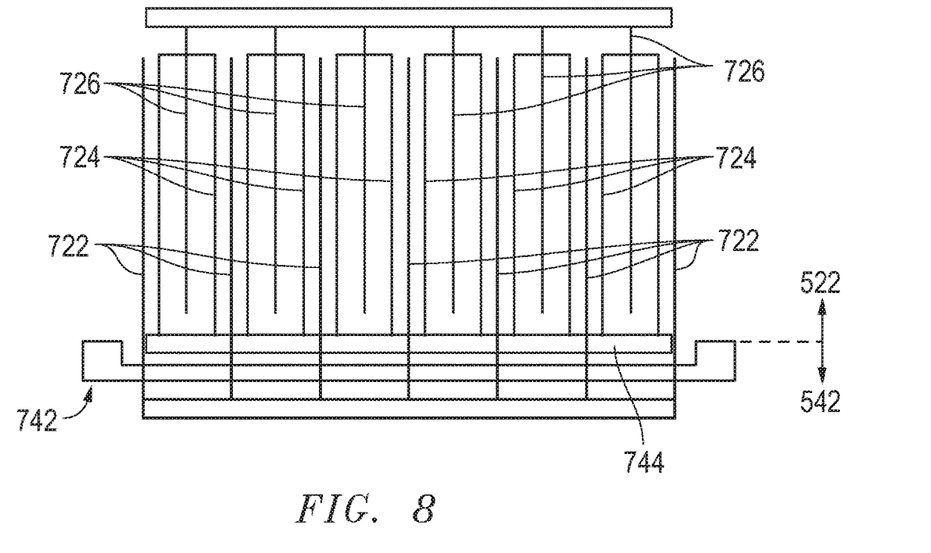
FIG. 8 includes an illustration of a top view of the workpiece after forming the source and drain electrodes and set of interconnects as seen in FIG. 7.

FIG. 7 includes the workpiece after forming an insulating layer 700, source and drain electrodes 722 and 725, a gate electrode interconnect 724, a gate terminal interconnect 742, and another interconnect 744. The insulating layer 700 can be formed over the barrier layer 508, the gate electrode 524 and the semiconductor member 544. The insulating layer 700 can include an oxide, a nitride, or an oxynitride. The insulating layer 700 can have a thickness in a range from 50 nm to 500 nm. The insulating layer 700 can be patterned to define contact openings for the source and drain electrodes 722 and 726 and the interconnects 724, 742, and 744. In an embodiment, the contact openings can extend through the insulating layer 700 and land on the barrier layer 508, gate electrode 524 and the semiconductor member 544. In another embodiment, the contact openings for the source and drain electrodes 722 and 726 and interconnect 744 can extend through and part of, but not all, of the thickness of the barrier layer 508 or extend through all of the thickness of the barrier layer 508 and contact the channel layer 506.

A conductive layer is formed over the insulating layer 700 and within the contact openings. The conductive layer can include a single film or a plurality of films. The conductive layer can include an adhesion film and a barrier film. Such films may include Ta, TaSi, Ti, TiW, TiSi, TiN, or the like. The conductive layer can further include a conductive bulk film. The bulk film can include Al, Cu, or another material that is more conductive than other films within the conductive layer. In an embodiment, the bulk film can include at least 90 wt. % Al or Cu. The bulk film can have a thickness that is at least as thick as the other films within the conductive layer. In an embodiment, the bulk film has a thickness in a range from 20 nm to 900 nm and, in a more particular embodiment, in a range from 50 nm to 500 nm. More or fewer films can be used in the conductive layer. The number and composition of the films within the conductive layer can depend on the needs or desires for a particular application. After reading this specification, skilled artisans will be able to determine the composition of the conductive layer that is tailored to their devices. The conductive layer is patterned to form the source and drain electrodes 722 and 726, and interconnects 724, 742, and 744.

The contact opening for the source and drain electrodes 722 and 726 and interconnect 744 and the contact openings for the interconnects 724 and 742 may be defined using the same process sequence or different process sequences. The source and drain electrodes 722 and 726 and interconnect 744 and the interconnects 724 and 742 may be formed using the same process sequence or different process sequences. Furthermore, the source and drain electrodes 722 and 726 and the interconnect 744 may be formed at one interconnect level, and the interconnects 724 and 742 may be formed at a different interconnect level.

Figure 9:
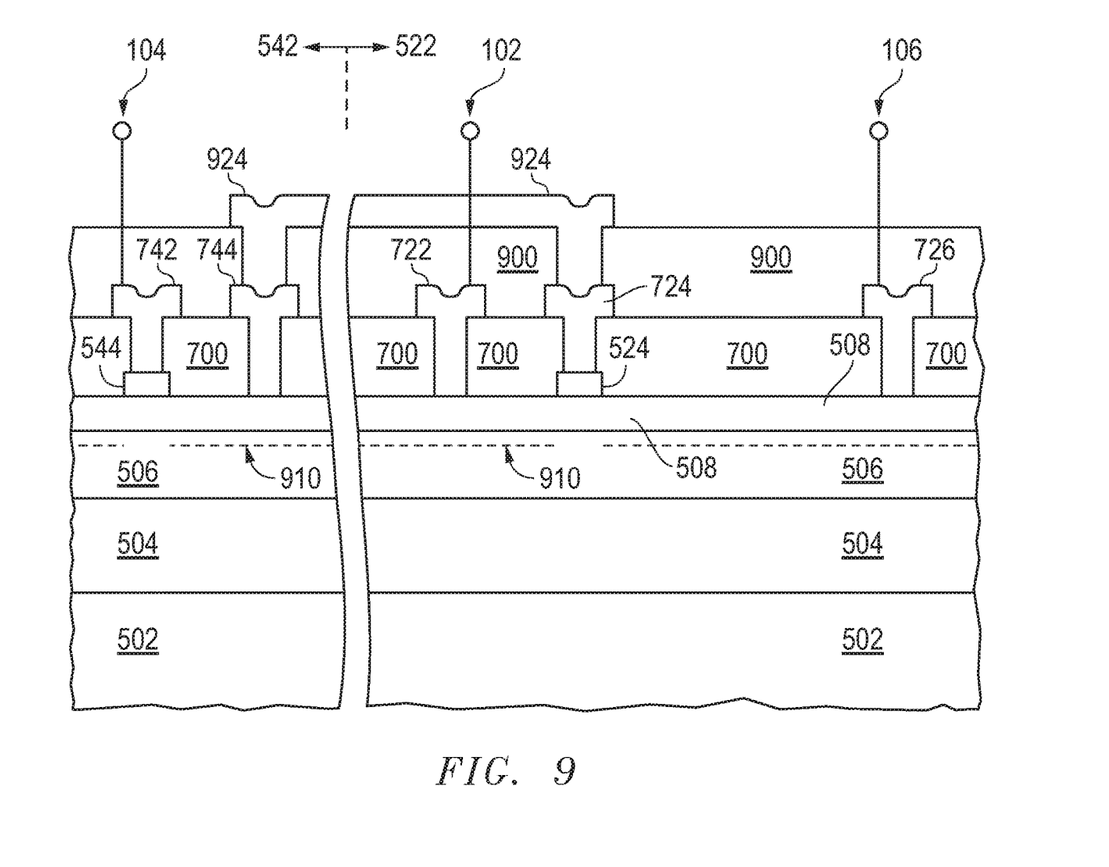
FIG. 9 includes an illustration of a cross-sectional view of the workpiece of FIG. 7 after forming another level of interconnects.

FIG. 9 includes the workpiece after forming an insulating layer 900 and an interconnect 924. A combination of the interconnects 744 and 924 correspond to the node between the diode 142 and the gate of the transistor 122 in FIGS. 1 to 3. The insulating layer 900 includes any of the compositions and thicknesses as previously described with respect to the insulating layer 700. The insulating layer 900 can have the same composition or different compositions as compared to the insulating layer 700, and the insulating layer 900 can have the same thickness or different thicknesses as compared to the insulating layer 700. The insulating layer 900 can be patterned to define via openings for the interconnect 924. A conductive layer is formed over the insulating layer 900 and within the via openings. The conductive layer for the interconnect 924 includes any of the compositions and thicknesses as previously described with respect to the source and drain electrodes 722 and 726 and interconnects 724, 742, and 744. The conductive layer for the interconnect 924 can have the same composition or different compositions as compared to the conductive layer used for the underlying electrodes and interconnects, 722, 724, 726, 742, and 744, and the conductive layer for the interconnect 924 can have the same thickness or different thicknesses as compared to the conductive layer used for the underlying electrodes and interconnects, 722, 724, 726, 742, and 744. The conductive layer is patterned to form the interconnect 924.

One or more interconnect levels and a passivation layer may be formed over the workpiece. Each interconnect level can include an interlevel dielectric layer and interconnects. A conductive layer can be used at each interconnect level. The conductive layer may be the same or different from the other conductive layers described earlier in this specification. A substantially completed electronic device, including an enhancement-mode HEMT, has been formed. The 2DEG 910 is discontinuous under the gate electrode 524 and the semiconductor member 544. When the proper voltage is applied, the 2DEG becomes continuous including under the gate electrode 524 and the semiconductor member 544. As will be discussed later in this specification with respect to FIG. 12, the threshold voltage to turn on the circuit 100 can be increased to f-over 3 V.

Figure 10:
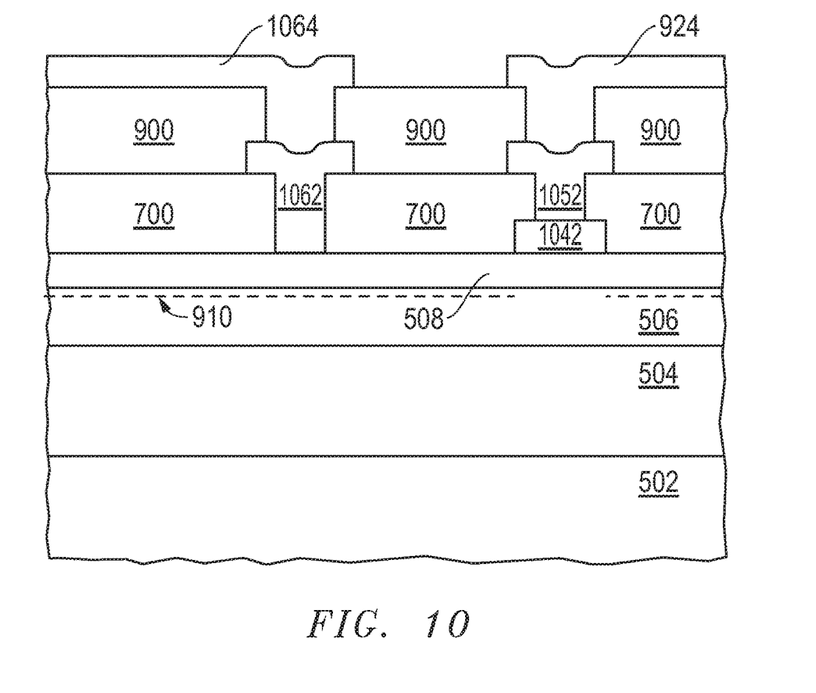
FIG. 10 includes an illustration of a cross-sectional view of another portion of the workpiece of FIG. 9 wherein such other portion includes one of the diodes illustrated in FIG. 2.

The structures illustrated in FIG. 9 can be used for the diode 142 and transistor 122 as illustrated in FIGS. 1, 2, and 3. The circuits in FIGS. 2 and 3 include an additional component. FIG. 10 illustrates an exemplary structure that can be used for the diode 252. In FIG. 10, a semiconductor member 1042 can be formed at the same time as the semiconductor member 542. As compared to the gate electrode 524, the semiconductor member 1042 may be formed during a different process sequence, or at least one operation in the process sequence to form the gate electrode 524 may be shared with the process sequence to form the semiconductor member 1042. For example, to make the threshold voltage lower than that of the diode that includes the semiconductor member 1042, the semiconductor member 1042 can be patterned to be narrower than the gate electrode 524. In another embodiment, a thinner p-type GaN layer may be used to from the semiconductor member 1042, as compared to the p-type GaN layer used to form the gate electrode 524. The diode 252 can be formed at the interface of the semiconductor member 1042 and the barrier layer 508.

An interconnect 1052 can be formed at the same time as the gate terminal interconnect 742. Another portion of the interconnect 924 is electrically connected to and contacts the interconnect 1052. Thus, the interconnect 1052 can also be part of the node between the anode of the diode 252, the cathode of the diode 142, and gate of the transistor 122 (see FIG. 2). An interconnect 1062 can be formed at the same time as the gate terminal interconnect 742, and the interconnect 1064 can be formed as the same time as the interconnect 942. Although not illustrated, the interconnect 1064 or potentially another interconnect can be connected to the gate terminal 104. Thus, the interconnects 742, 1062, and 1064 can be parts of the node between the gate terminal 104, the cathode of the diode 252, and the anode of the diode 142.

FIG. 9 includes the workpiece after forming an insulating layer 900 and an interconnect 924. A combination of the interconnects 744 and 924 correspond to the node between the diode 142 and the gate of the transistor 122 in FIGS. 1 to 3. The insulating layer 900 includes any of the compositions and thicknesses as previously described with respect to the insulating layer 700. The insulating layer 900 can have the same composition or different compositions as compared to the insulating layer 700, and the insulating layer 900 can have the same thickness or different thicknesses as compared to the insulating layer 700. The insulating layer 900 can be patterned to define via openings for the interconnect 924. A conductive layer is formed over the insulating layer 900 and within the via openings. The conductive layer for the interconnect 924 includes any of the compositions and thicknesses as previously described with respect to the source and drain electrodes 722 and 726 and interconnects 724, 742, and 744. The conductive layer for the interconnect 924 can have the same composition or different compositions as compared to the conductive layer used for the underlying electrodes and interconnects, 722, 724, 726, 742, and 744, and the conductive layer for the interconnect 924 can have the same thickness or different thicknesses as compared to the conductive layer used for the underlying electrodes and interconnects, 722, 724, 726, 742, and 744. The conductive layer is patterned to form the interconnect 924.

One or more interconnect levels and a passivation layer may be formed over the workpiece. Each interconnect level can include an interlevel dielectric layer and interconnects. A conductive layer can be used at each interconnect level. The conductive layer may be the same or different from the other conductive layers described earlier in this specification. A substantially completed electronic device, including an enhancement-mode HEMT, has been formed. The 2DEG 910 is discontinuous under the gate electrode 524 and the semiconductor member 544. When the proper voltage is applied, the 2DEG becomes continuous including under the gate electrode 524 and the semiconductor member 544. As will be discussed later in this specification with respect to FIG. 12, the threshold voltage to turn on the circuit 100 can be increased to f-over 3 V.

The structures illustrated in FIG. 9 can be used for the diode 142 and transistor 122 as illustrated in FIGS. 1, 2, and 3. The circuits in FIGS. 2 and 3 include an additional component. FIG. 10 illustrates an exemplary structure that can be used for the diode 252. In FIG. 10, a semiconductor member 1042 can be formed at the same time as the semiconductor member 542. As compared to the gate electrode 524, the semiconductor member 1042 may be formed during a different process sequence, or at least one operation in the process sequence to form the gate electrode 524 may be shared with the process sequence to form the semiconductor member 1042. For example, to make the threshold voltage lower than that of the diode that includes the semiconductor member 1042, the semiconductor member 1042 can be patterned to be narrower than the gate electrode 524. In another embodiment, a thinner p-type GaN layer may be used to from the semiconductor member 1042, as compared to the p-type GaN layer used to form the gate electrode 524. The diode 252 can be formed at the interface of the semiconductor member 1042 and the barrier layer 508.

An interconnect 1052 can be formed at the same time as the gate terminal interconnect 742. Another portion of the interconnect 924 is electrically connected to and contacts the interconnect 1052. Thus, the interconnect 1052 can also be part of the node between the anode of the diode 252, the cathode of the diode 142, and gate of the transistor 122 (see FIG. 2). An interconnect 1062 can be formed at the same time as the gate terminal interconnect 742, and the interconnect 1064 can be formed as the same time as the interconnect 942. Although not illustrated, the interconnect 1064 or potentially another interconnect can be connected to the gate terminal 104. Thus, the interconnects 742, 1062, and 1064 can be parts of the node between the gate terminal 104, the cathode of the diode 252, and the anode of the diode 142.

In another embodiment (not illustrated), the semiconductor member 1042 may not be present and the interconnect 1052 may contact the barrier layer 508 to form a Schottky diode. In this embodiment, the interconnect 1052 may be formed at the same time as the source and drain electrodes 722 and 726. In another embodiment, the interconnect 1052 may be formed with a metal having a lower work function as compared to the source and drain electrodes 722 and 726. In a further embodiment, a junction barrier diode may be used.

Figure 11:
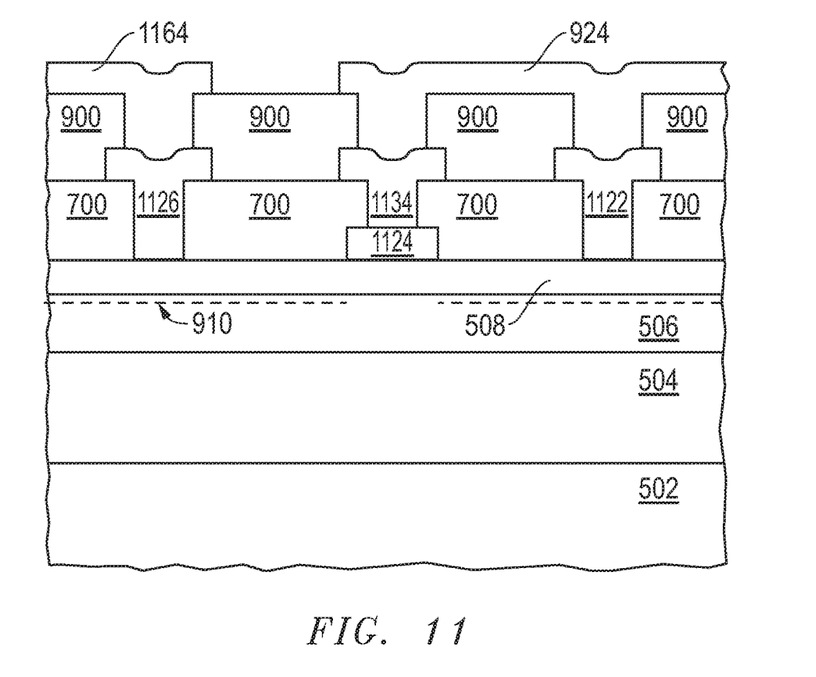
FIG. 11 includes an illustration of a cross-sectional view of another portion of the workpiece of FIG. 10 wherein such other portion includes a transistor connected in parallel with the diode, as illustrated in FIG. 3.

FIG. 11 includes an exemplary transistor structure that can be used for the transistor 352 (in FIG. 3). In FIG. 11, a gate electrode 1124 can be formed at the same time as the gate electrode 524. A source electrode 1122 and a drain electrode 1126 can be formed at the same time as the source and drain electrodes 722 and 726. An interconnect 1134 can be formed at the same time as the gate electrode interconnect 724. The source electrode 1122 and the interconnects 1134 and 924 can be parts of the node between the gate and source of the transistor 352, the cathode of the diode 142, and gate of the transistor 122 (see FIG. 3). An interconnect 1164 can be formed as the same time as the interconnect 924. Although not illustrated, the interconnect 1164 or potentially another interconnect can be connected to the gate terminal 104. Thus, the drain electrode 1126 and the interconnects 742 and 1164 can be parts of the node between the gate terminal 104, the cathode of the diode 252, and the anode of the diode 142.

For the circuits 200 and 300, a gate voltage in a range from −0.5 V to −1 V may be used to turn off the circuit and take the voltage on the gate electrode 724 of the transistor 122 to 0 V.

Figure 12:
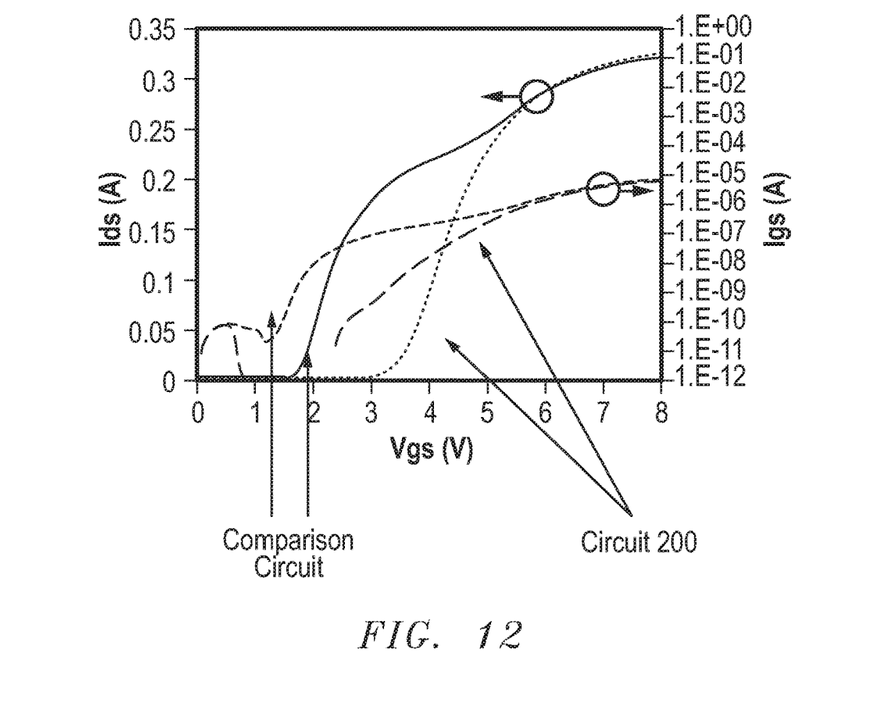
FIG. 12 includes a plot of drain current and gate current as a function of gate voltage for a comparison circuit and the circuit of FIG. 2.

FIG. 12 includes a simulation of a comparison circuit and the circuit 200 in FIG. 2. The comparison circuit can be identical to the circuit 200 except the diodes 142 and 252 are not present. Thus, the gate terminal 104 is directly connected to the gate of the transistor 122. The circuit is on when the drain current (current flowing from the drain terminal 106 to the source terminal 102, or Ids) is greater than 0 A. As seen in FIG. 12, the threshold voltage (Vth) of the comparison circuit is approximately 1.5 V (the voltage difference between the gate terminal 104 and the source terminal 102, or Vgs≈1.5 V), and Vth of the circuit 200 is approximately 3.1 V (Vgs≈3.1 V). Thus, the addition of the diode 142 increases Vth, and in an embodiment, such an increase is double the Vth of the comparison circuit. FIG. 12 also includes plots of gate current (current flowing from the gate terminal 104 to the source terminal 102, or Igs) as a function of Vgs. In a range from approximately 3.1 V to 5.3 V, Igs for the circuit 200 is lower than the comparison circuit. At higher Vgs, the Igs is approximately the same for both circuits.

Figure 13:
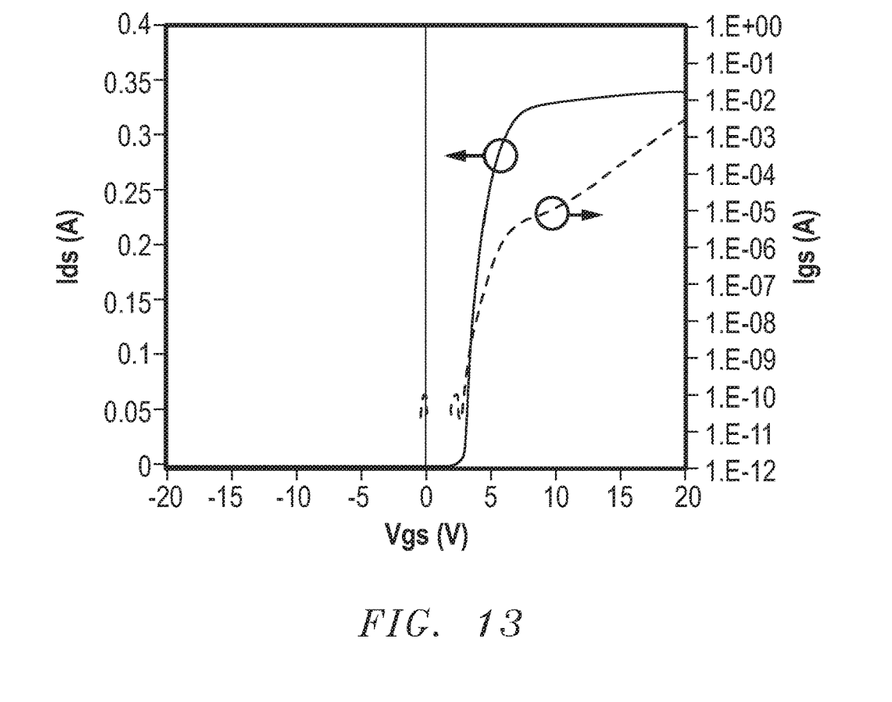
FIG. 13 includes a plot of drain current as a function of drain voltage for the circuit of FIG. 2.

FIG. 13 includes a simulation of the circuit 200 in FIG. 2 to ensure the circuit 200 has acceptable performance when Vgs is in a range from −20 V to 20 V. When the Vgs is approximately 8 V, saturation current for Ids is reached and is approximately 0.33 A for the particular simulation. Skilled artisans understand that the actual value for the saturation current is a function of the particular transistor structure used for the transistor 122 (e.g., channel width of the transistor structure) and is less affected by the presence or absence of the diodes 142 and 252. When Vgs is 10 V, Igs is approximately $1 \times 10^{-5}$ A and does not reach $1 \times 10^{-3}$ A until Vgs reaches approximately 19 V. Thus, the circuit 200 has acceptable performance when Vgs is varied from −20 V to 20 V.

Embodiments as described herein can help to provide a circuit that allows a threshold voltage to be tailored to the needs or desires for a particular application. An enhancement-mode transistor can have its gate coupled to one or more diodes that can be used to increase the voltage between the source and gate terminals used to turn on the circuit. The geometry and number of the one or more diodes can be designed to achieve a desired threshold voltage for the circuit. The circuit has good drain current characteristics with acceptably low gate current.

In some embodiments, another diode or a transistor can be in parallel with the one or more diodes to help dissipate charge quicker than if such other diode or transistor is not present. In a particular embodiment, a back-to-back diode configuration can be used. When the gate voltage of the circuit in increased, current flows through the one or more diodes along a charge accumulation branch to the gate of the enhancement-mode transistor. When the circuit is turned off, the charge at the gate of the enhancement-mode transistor can be dissipated through the other diode along a charge dissipation branch of the circuit.

In another particular embodiment, a configuration can include a transistor along the dissipation branch of the circuit. The circuit 300 turns on in a manner similar to the back-to-back configuration (circuit 200). When the circuit is turned off, the voltage on the source and gate of the transistor is higher than the voltage on the drain. Charge will dissipate through the transistor along the charge dissipation branch of the transistor.

The embodiments described herein provide for better control of the threshold voltage of the circuit as compared to a conventional circuit that has a diode with a reverse configuration (a single diode with a cathode coupled to the gate terminal and an anode coupled to the gate of the enhancement-mode transistor). The embodiments can further provide a threshold voltage for the circuit that is more stable over time.

The embodiments are well suited for enhancement-mode transistors, and enhancement-mode HEMTs in particular. Components of the circuit can be on the same die and be formed within or over the same channel layer. In a particular embodiment, the components along the conduction path between the gate terminal and the gate of the enhancement-mode transistor may be located under a gate pad or a gate runner, and thus, the components do not increase the area occupied by the circuit. The formation of the components does not require any additional masking or other processing operations. Existing masking layers can be modified to provide features for the components.

Many different aspects and embodiments are possible. Some of those aspects and embodiments are described below. After reading this specification, skilled artisans will appreciate that those aspects and embodiments are only illustrative and do not limit the scope of the present invention. Embodiments may be in accordance with any one or more of the items as listed below.

Embodiment 1. An electronic device can include:
    a channel layer overlying a substrate;
    a barrier layer overlying the channel layer;
    a gate electrode of a first transistor overlying the channel layer, wherein the first transistor is an enhancement-mode transistor;
    a gate terminal; and a first component having a threshold voltage, wherein the first component is disposed along a current path between the gate terminal and the gate electrode.

Embodiment 2. The electronic device of Embodiment 1, wherein the first component is under a gate pad or under a gate runner.

Embodiment 3. The electronic device of Embodiment 1, wherein the first component is a first diode having an anode and a cathode, wherein the anode is coupled to the gate terminal, and the cathode is coupled to the gate electrode.

Embodiment 4. The electronic device of Embodiment 3, wherein the first diode is a Schottky diode, a pn junction diode, or a junction barrier diode.

Embodiment 5. The electronic device of Embodiment 4, further including a second component connected in parallel with the first component.

Embodiment 6. The electronic device of Embodiment 5, wherein the second component is a second diode having an anode and a cathode, wherein the anode of the second diode is coupled to the cathode of the first diode, and the cathode of the second diode is coupled to the anode of the first diode.

Embodiment 7. The electronic device of Embodiment 5, wherein the second component is a second transistor having a source electrode, a gate electrode, and a drain electrode, wherein the source and gate electrodes of the second transistor are coupled to the cathode of the first diode, and the drain electrode of the second transistor is coupled to the anode of the first diode.

Embodiment 8. The electronic device of Embodiment 7, wherein the second transistor is a depletion-mode high electron mobility transistor.

Embodiment 9. The electronic device of Embodiment 5, wherein a threshold voltage of the second component is less than a threshold voltage of the first transistor.

Embodiment 10. The electronic device of Embodiment 5, wherein the first transistor and the first and second components are on a same die.

Embodiment 11. The electronic device of Embodiment 5, further including a second diode having an anode and a cathode, wherein the anode of the second diode is coupled to the cathode of the first diode, and the cathode of the second diode is coupled to the gate electrode of the first transistor.

Embodiment 12. The electronic device of Embodiment 1, wherein the first transistor has a first threshold voltage, and the second component has a second threshold voltage that is less than the first threshold voltage.

Embodiment 13. The electronic device of Embodiment 1, wherein the channel layer includes $Al_zGa_{(1-z)}N$, wherein $0 \le z \le 0.1$, and the barrier layer includes $Al_xIn_yGa_{(1-x-y)}N$, wherein $0 < x \le 0.6$ and $0 \le y \le 0.3$.

Embodiment 14. The electronic of Embodiment 5, wherein:
the channel layer includes GaN,
the barrier layer includes $Al_xGa_{(1-x)}N$, wherein $0 < x \le 0.4$,
the first transistor is an enhancement-mode high electron mobility transistor,
the gate electrode includes a p-type semiconductor material,
the second component is:
  a second diode having an anode and a cathode, wherein the anode of the second diode is coupled to the cathode of the first diode, and the cathode of the second diode is coupled to the anode of the first diode, or
  a second transistor that is a depletion-mode high electron mobility transistor having a source electrode, a gate electrode, and a drain electrode, wherein the source and gate electrodes of the second transistor are coupled to the cathode of the first diode, and the drain electrode of the second transistor is coupled to the anode of the first diode,
a threshold voltage of the second component is less than a threshold voltage of the first transistor, and
the first transistor and the first and second components are on a same die.

Embodiment 15. An electronic device can include:
a channel layer overlying a substrate;
a barrier layer overlying the channel layer;
a gate electrode of a first transistor overlying the channel layer;
a gate terminal; and
a second transistor having a source electrode, a gate electrode, and a drain electrode, wherein the source and gate electrodes of the second transistor are coupled to the gate electrode of the first transistor, and the drain electrode of the second transistor is coupled to the gate terminal.

Embodiment 16. The electronic device of Embodiment 15, wherein the second transistor is a depletion-mode transistor.

Embodiment 17. The electronic device of Embodiment 16, wherein the first transistor is an enhancement-mode transistor.

Embodiment 18. The electronic device of Embodiment 15, wherein the first and second transistors are high electron mobility transistors.

Embodiment 19. A circuit can include:
a drain terminal, a gate terminal, and a source terminal;
a first transistor that is an enhancement-mode transistor including a drain, a gate, and a source, wherein the drain is coupled to the drain terminal, and the source is coupled to the source terminal;
a first diode having an anode and a cathode, wherein the anode is coupled to the gate terminal, and the cathode is coupled to the gate of the first transistor.

Embodiment 20. The circuit of Embodiment 19, further including a component, wherein the component is:
a second diode having an anode and a cathode, wherein the anode of the second diode is coupled to the cathode of the first diode, and the cathode of the second diode is coupled to the anode of the first diode, or
a second transistor having a source, a gate, and a drain, wherein the source and gate electrodes of the second transistor are coupled to the cathode of the first diode, and the drain electrode of the second transistor is coupled to the anode of the first diode,
wherein the first transistor is an enhancement-mode high electron mobility transistor.

Note that not all of the activities described above in the general description or the examples are required, that a portion of a specific activity may not be required, and that one or more further activities may be performed in addition to those described. Still further, the order in which activities are listed is not necessarily the order in which they are performed.

Benefits, other advantages, and solutions to problems have been described above with regard to specific embodiments. However, the benefits, advantages, solutions to problems, and any feature(s) that may cause any benefit, advantage, or solution to occur or become more pronounced are not to be construed as a critical, required, or essential feature of any or all the claims.

The specification and illustrations of the embodiments described herein are intended to provide a general understanding of the structure of the various embodiments. The specification and illustrations are not intended to serve as an exhaustive and comprehensive description of all of the elements and features of apparatus and systems that use the structures or methods described herein. Separate embodiments may also be provided in combination in a single embodiment, and conversely, various features that are, for brevity, described in the context of a single embodiment, may also be provided separately or in any subcombination. Further, reference to values stated in ranges includes each and every value within that range. Many other embodiments may be apparent to skilled artisans only after reading this specification. Other embodiments may be used and derived from the disclosure, such that a structural substitution, logical substitution, or another change may be made without departing from the scope of the disclosure. Accordingly, the disclosure is to be regarded as illustrative rather than restrictive.

What is claimed is:

1. An electronic device comprising:
    a channel layer overlying a substrate, wherein the channel layer includes $Al_zGa_{(1-z)}N$ wherein $0 \le z \le 0.1$;
    a barrier layer overlying the channel layer, wherein the barrier layer includes $Al_xIn_yGa_{(1-x-y)}N$, wherein $0 < x \le 0.6$ and $0 \le y \le 0.3$;
    a gate electrode of a first transistor overlying the channel layer, wherein the first transistor is an enhancement-mode transistor;
    a gate terminal; and
    a first diode includes an anode electrically connected to the gate terminal and a cathode electrically connected to the gate electrode.

2. The electronic device of claim 1, wherein the first diode is under a gate pad or under a gate runner.

3. The electronic device of claim 1, wherein the first diode is a Schottky diode, a pn junction diode, or a junction barrier diode.

4. The electronic device of claim 1, further comprising a component, wherein:
    the channel layer includes GaN,
    the barrier layer includes $Al_xGa_{(1-x)}N$, wherein $0 < x \le 0.4$,
    the first transistor is a high electron mobility transistor,
    the gate electrode includes a p-type semiconductor material,
    the component is:
        a second diode having an anode and a cathode, wherein the anode of the second diode is coupled to the cathode of the first diode, and the cathode of the second diode is coupled to the anode of the first diode, or
        a second transistor that is a depletion-mode high electron mobility transistor having a source electrode, a gate electrode, and a drain electrode, wherein the source and gate electrodes of the second transistor are coupled to the cathode of the first diode, and the drain electrode of the second transistor is coupled to the anode of the first diode,
    a threshold voltage of the component is less than a threshold voltage of the first transistor, and
    the first transistor, the first diode, and the component are on a same die.

5. The electronic device of claim 1, wherein the first diode is a single diode.

6. The electronic device of claim 1, wherein the first diode is a set of serially connected diodes configured such that each diode of the serially connected diodes has a forward bias direction from the gate terminal to the gate electrode of the first transistor, wherein:
    a particular diode within the set of serially connected diodes is closer to the gate terminal as compared to any other diode within the set of serially connected diodes,
    an anode of the particular diode is electrically connected to the gate terminal,
    another particular diode within the set of serially connected diodes is closer to the gate electrode of the first transistor as compared to any other diode within the set of serially connected diodes, and
    a cathode of the other diode is electrically connected to the gate electrode.

7. The electronic device of claim 1, further comprising a component having a first terminal electrically connected to the cathode of the first diode and a second terminal electrically connected to the anode of the first diode, wherein the component is configured such that a forward bias direction of the component is from the gate electrode to the gate terminal.

8. The electronic device of claim 7, wherein the component is a second diode, wherein:
    the first terminal of the component is an anode of the second diode,
    the second terminal of the component is a cathode of the second diode,
    the anode of the second diode is electrically connected to the gate electrode of the first transistor, and
    the cathode of the second diode is coupled to the anode of the first diode.

9. The electronic device of claim 7, wherein a threshold voltage of the component is less than a threshold voltage of the first transistor.

10. The electronic device of claim 7, wherein the first transistor, the first diode, and the component are on a same die.

11. The electronic device of claim 7, wherein the component is a second transistor having a source electrode, a gate electrode, and a drain electrode, wherein the source and gate electrodes of the second transistor are electrically connected to the cathode of the first diode, and the drain electrode of the second transistor is coupled to the anode of the first diode.

12. The electronic device of claim 11, wherein the second transistor is a depletion-mode high electron mobility transistor.

13. The electronic device of claim 11, wherein the second transistor is an enhancement-mode transistor.

14. The electronic device of claim 11, wherein the first and second transistors are high electron mobility transistors.

15. A circuit including:
    a first transistor that is an enhancement-mode transistor including a drain, a gate, and a source, wherein the drain is coupled to the drain terminal, and the source is coupled to the source terminal;
    a first diode having an anode and a cathode, wherein the anode is coupled to the gate terminal, and the cathode is coupled to the gate of the first transistor; and
    a component having a first terminal coupled to the gate electrode of the first transistor and a second terminal coupled to the gate terminal, wherein:
        the component is configured such that a forward bias direction is from the gate of the first transistor to the gate terminal, and
        the component has a threshold voltage lower than a threshold voltage of the first transistor.

16. The circuit of claim 15, wherein the component is:
a second diode having an anode and a cathode, wherein the anode of the second diode is electrically connected to the cathode of the first diode, and the cathode of the second diode is coupled to the anode of the first diode, or
a second transistor having a source, a gate, and a drain, wherein the source and gate electrodes of the second transistor are electrically connected to the cathode of the first diode, and the drain electrode of the second transistor is coupled to the anode of the first diode,
wherein the first transistor is a high electron mobility transistor.

17. An electronic device comprising:
a channel layer overlying a substrate;
a barrier layer overlying the channel layer;
a gate electrode of a transistor overlying the channel layer, wherein the transistor is an enhancement-mode transistor;
a gate terminal; and
a diode having an anode and a cathode and disposed along a current path between the gate terminal and the gate electrode, wherein the anode of the diode is coupled to the gate terminal, and a cathode of the diode is coupled to the gate electrode, and
a component coupled to the gate electrode and the gate terminal, wherein a threshold voltage of the component is less than a threshold voltage of the transistor,
wherein:
the gate electrode of the transistor, the cathode of the diode, and a terminal of the component are electrically connected to one another, and
the component is configured such that a forward bias direction of the component is from the gate electrode of the transistor to the gate terminal.

* * * * *